United States Patent [19]

Bailey

[11] Patent Number: 4,851,709
[45] Date of Patent: Jul. 25, 1989

[54] VARIABLE FREQUENCY, FIXED AMPLITUDE DIGITAL SWEEP GENERATOR

[75] Inventor: Bill E. Bailey, Kent, Wash.

[73] Assignee: Pacific Northwest Eectronics, Seattle, Wash.

[21] Appl. No.: 96,345

[22] Filed: Sep. 11, 1987

[51] Int. Cl.[4] .......................... H03K 4/02; H03K 4/08
[52] U.S. Cl. .................................. 307/228; 307/227; 307/261; 307/519; 307/490; 328/181; 328/35; 328/36; 328/186
[58] Field of Search ............... 307/228, 227, 261, 519, 307/490; 328/181, 35, 36, 185, 186, 184, 140, 127

[56] References Cited

U.S. PATENT DOCUMENTS

| | | | |
|---|---|---|---|
| 3,603,879 | 9/1971 | Pelta et al. | 324/161 |
| 3,619,767 | 11/1971 | Pelta et al. | 324/17 |
| 3,638,107 | 1/1972 | Pelta et al. | 324/15 |
| 3,665,294 | 5/1972 | Pelta et al. | 324/16 |
| 3,676,784 | 7/1972 | Le Comte | 307/227 |
| 3,714,499 | 1/1973 | Pelta et al. | 315/22 |
| 4,284,906 | 8/1981 | Manfredi | 328/181 |
| 4,399,407 | 8/1983 | Kling et al. | 324/379 |
| 4,476,531 | 10/1984 | Marino et al. | 364/431.01 |
| 4,669,099 | 5/1987 | Zinn | 307/271 |

*Primary Examiner*—John S. Heyman
*Assistant Examiner*—Nancy Thai
*Attorney, Agent, or Firm*—Christensen, O'Connor, Johnson & Kindness

[57] ABSTRACT

A variable frequency, fixed amplitude digital sweep generator for use with a cathode ray tube based instrument useful in troubleshooting, diagnosing, and servicing spark ignition internal combustion engines. A first counter (8) measures the period between the leading edges of a trigger pulse, $V_T$, derived from the ignition system of an internal combustion engine by counting divided down clock pulses. A comparator (10) compares the count of the first counter (8) to the count of a second counter (11), which is clocked at a rate which is an integral multiple of the clock rate of the first counter (8). The comparator (10) produces an output pulse when the output of the two counters (8, 11) match. Each comparator pulse causes a monostable multivibrator (17) to produce a rectangular wave, $V_M$. The constant width rectangular waves, $V_M$, are integrated by an integration circuit (14) that produces a stair step waveform, $V_I$, which is smoothed by a filter circuit (15) and an error signal feedback circuit (16) to create a linear ramp signal, $V_O$, having the same frequency as the frequency of the trigger pulse, $V_T$. Since the comparator (10) produces the same number of pulses between trigger pulses, $V_T$, regardless of the frequency of the trigger pulses, $V_T$, the amplitude of the linear ramp (sawtooth) output, $V_O$, of the digital sweep generator is constant.

19 Claims, 3 Drawing Sheets

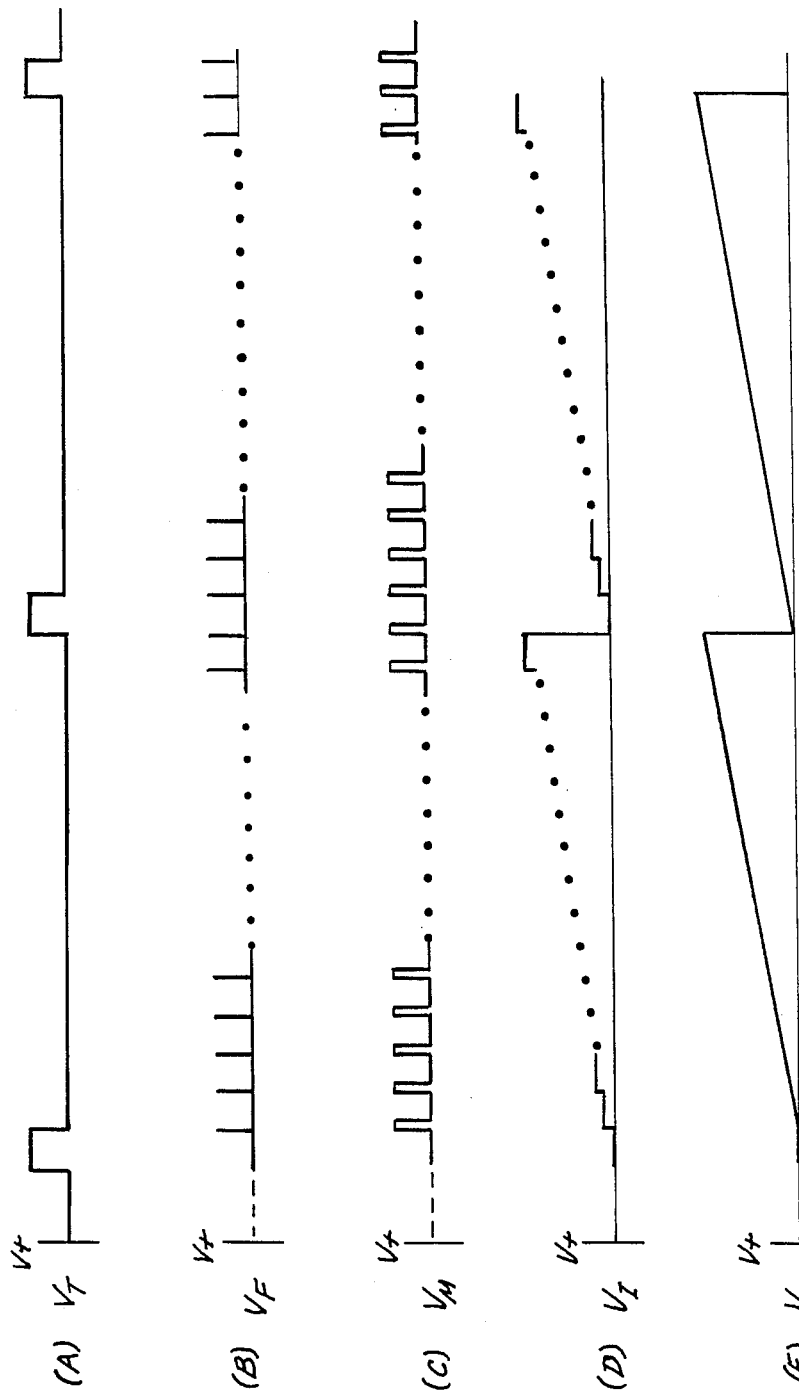

VARIABLE FREQUENCY, FIXED AMPLITUDE DIGITAL SWEEP GENERATOR

TECHNICAL AREA

This invention relates to signal generators and, more particularly, triggered sweep generators for use with cathode ray tube based instruments.

BACKGROUND OF THE INVENTION

The use of cathode ray tube based instruments, such as oscilloscopes, in analyzing internal combustion engine performance has become prevalent in recent years. The increased use of these instruments is in part due to the increasing complexity of the electronic portion of contemporary internal combustion engines and in part due to the increasing technical capabilities of the persons performing the analysis of internal combustion engines. The spectrum of uses for such instruments in analyzing internal combustion engines ranges from monitoring the timing of the electrical and mechanical functions of the engine to determine the coincidence of spark discharge and cylinder valve operation to measuring the multitude of electrical signals necessary for controlling today's internal combustion engine.

In normal use, a linear sweep signal is repetitively applied to the horizontal deflection plates, or coils, of the cathode ray tube of an oscilloscope. The signal to be displayed on the oscilloscope is applied to the vertical deflection plates, or coils, of the tube. The linear sweep, or ramp signal, provides the linear horizontal time scale for the signal to be displayed. The repetitive linear sweep, or ramp signal, commonly has a sawtooth waveform. That is, the linear sweep or ramp signal has a slow rise time and a fast fall time. To sustain linearity, the sawtooth waveform must rise to a fixed amplitude at a constant rate. While the linearity of the fall slope of an oscilloscope sawtooth wave is not important, the linearity of the rise slope is important since the rise slope forms the horizontal time scale of the oscilloscope. Further, the amplitude of the sawtooth waveform must remain constant regardless of the frequency of the sawtooth waveform.

Past attempts to create sawtooth waveform signals in oscilloscopes have utilized wave shaping circuitry and averaging techniques to convert analog signals into sawtooth signals having a fixed amplitude and a linear rise slope. While thusly generated sweep signals can be synchronized by a trigger pulse, the averaging nature of analog circuits requires several cycles after a trigger pulse is first produced before a fixed amplitude sawtooth sweep signal is developed, resulting in a delay between the first occurrence of a trigger pulse and the production of a reliable display.

The delay between trigger pulse and reliable display associated with analog circuit generation of sweep signals results in the display trailing both the initial trigger pulse and changes in the trigger pulse by several cycles. If adequate time is not allowed for the sweep signal to accurately correspond to the trigger pulses, oscilloscope displays will be in error. When such an instrument is used to analyze the performance of an internal combustion engine, the response delay requires the engine to be run for longer periods of time. This is undesirable for several reasons. It creates an undesirable battery drain if the engine is not running. It also requires more operator time, thus adding to the cost associated with analyzing the engine.

As will be readily appreciated from the foregoing discussion, there is a need for a sweep generator for cathode ray tube based instruments that rapidly and quickly generates an accurate triggerd sweep signal. In particular, there is a need for a triggered sweep generator for cathode ray tube based internal combustion engine analyzers that generate an accurate triggered sweep signal more rapidly than prior art analog based triggered sweep generators.

SUMMARY OF THE INVENTION

In accordance with this invention, a variable frequency, fixed amplitude digital sweep generator that is ideally suited for use with cathode ray tube based instruments for the troubleshooting, diagnosing and servicing of spark ignition internal combustion engines is provided. The variable frequency, fixed amplitude digital sweep generator includes: a digital frequency multiplier that converts a variable frequency trigger pulse into a fixed number of multiple pulses; and, a frequency-to-ramp converter that converts the pulse output of the frequency multiplier into a linear ramp (e.g., sawtooth) waveform signal. The digital frequency multiplier includes first and second counters. The first counter is clocked at a first rate and counts clock pulses between the leading edges of the variable frequency trigger pulses, which preferably are derived from one of the spark plug wires of an internal combustion engine. The count total of the first counter is held by a latch circuit. A second counter counts at a second rate which is a multiple of the clock rate of the first counter. The clock pulse count of the first counter is compared to the clock pulse count of the second counter by a comparator that produces an output pulse each time the count of the second counter, which counts at a faster rate than the first counter, matches the count of the first counter. Thus, between trigger pulses, the comparator produces a series of pulses equal in number to the multiple difference between the first and second counters. The same multiple is produced regardless of the frequency of the trigger pulses. The frequency-to-ramp converter includes a monostable multivibrator that receives the pulse output of the comparator and produces a corresponding rectangular wave signal. An integrator integrates the rectangular wave signal output of the multivibrator and produces a stair step sawtooth waveform having a constant amplitude. The stair step sawtooth waveform is modified, initially by a filter circuit and subsequently by a feedback circuit, to remove the stair step portion of the waveform and produce a smooth sawtooth waveform of constant amplitude. The amplitude is constant because each rectangular wave causes the same incremental signal magnitude and because the same number of rectangular waves are produced regardless of the frequency of the trigger signal.

As can be readily appreciated from the foregoing, the invention provides a constant amplitude, linear ramp, sawtooth waveform signal having a variable frequency corresponding to the frequency of the trigger pulse. Because the sawtooth waveform is linear and the amplitude constant, the sawtooth waveform is ideally suited to control the sweep of a cathode ray tube based auto engine analysis oscilloscope.

BRIEF DESCRIPTION OF THE DRAWINGS

The foregoing and other features and advantages of this invention will become more readily appreciated as the same becomes better understood by reference to the following detailed description, and when taken in conjunction with the accompanying drawings, wherein.

DETAILED DESCRIPTION OF THE PREFERRED EMBODIMENT

Figure 1:
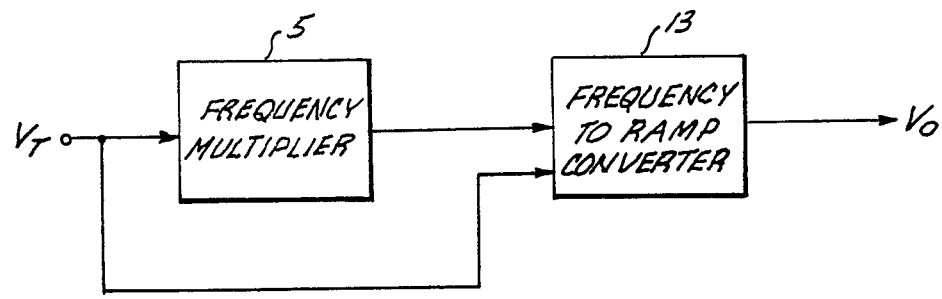
FIG. 1 is a block diagram of the digital sweep generator formed in accordance with this invention.
Figure 2:
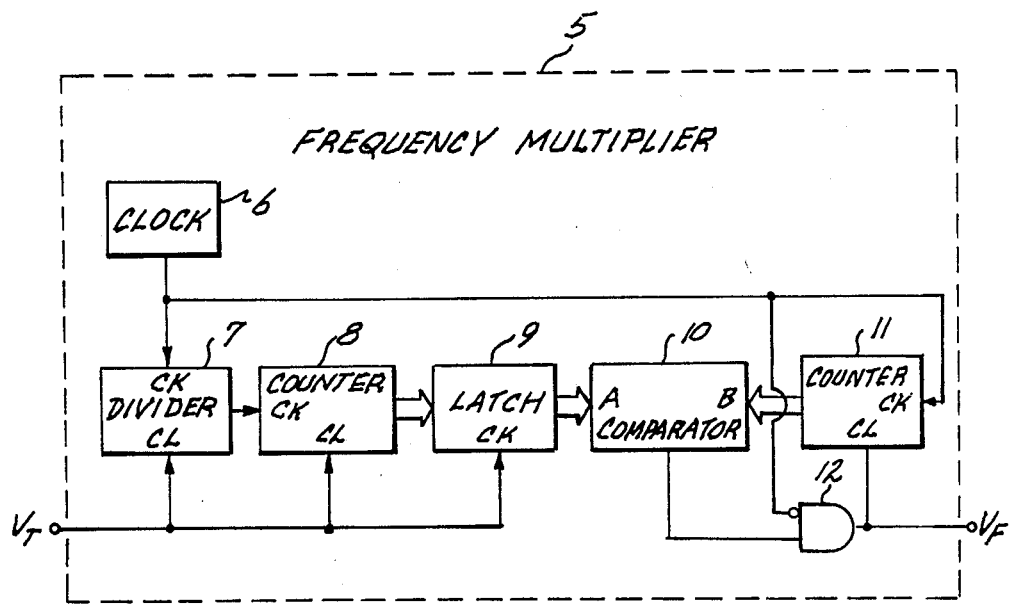
FIG. 2 is a schematic diagram of a frequency multiplier suitable for use in the embodiment of the invention depicted in FIG. 1.
Figure 3:
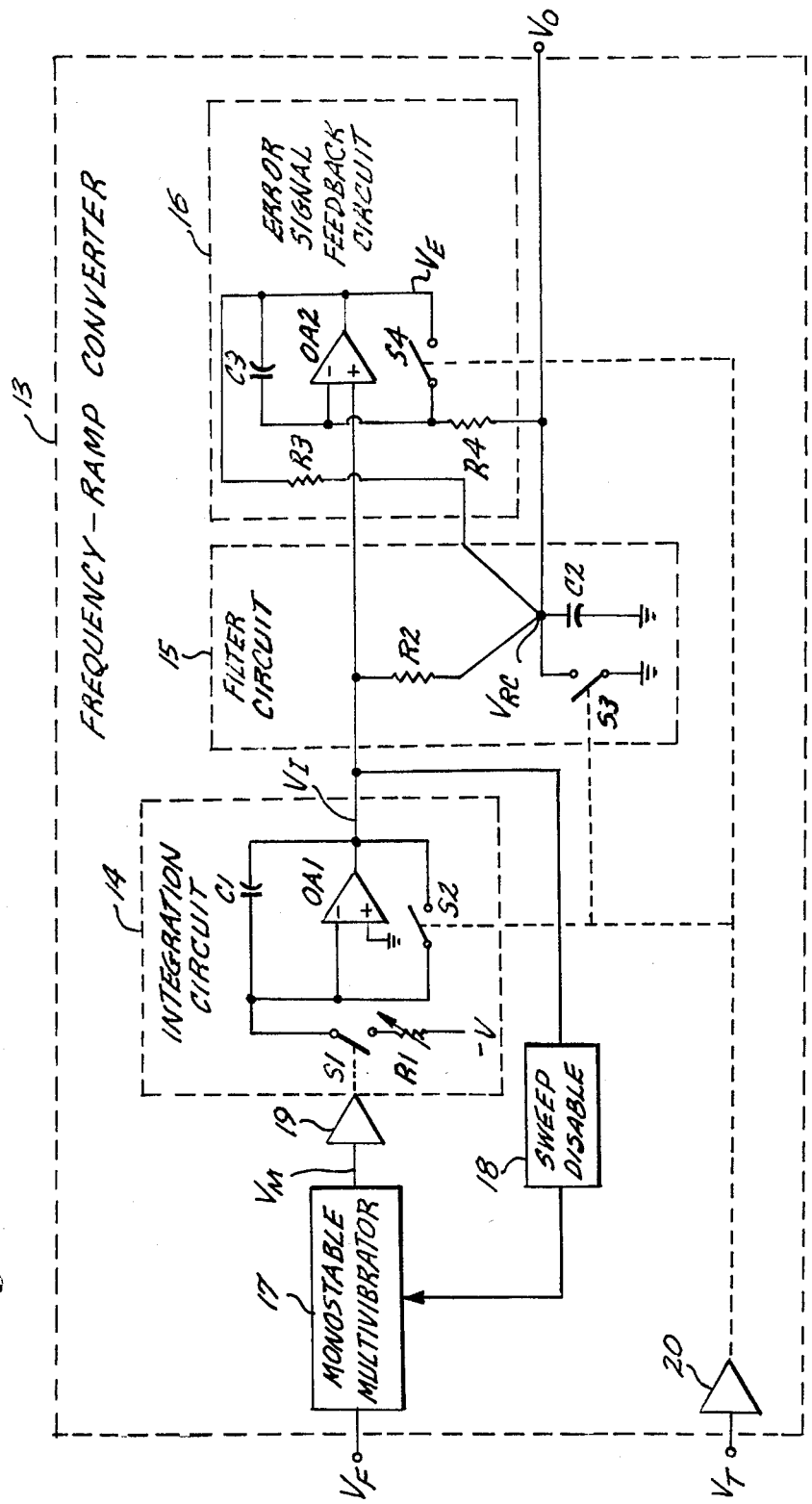
FIG. 3 is a schematic diagram of a frequency-to-ramp converter circuit suitable for use in the embodiment of the invention depicted in FIG. 1; and, FIG. 4, lines A through E, is a series of waveforms illustrating the form of the signal at various points in the digital frequency multiplier and the frequency-to-ramp converter depicted in FIGS. 2 and 3, respectively.

In general, a variable frequency, fixed amplitude digital sweep generator formed in accordance with the invention includes a frequency multiplier 5 (FIG. 1 or FIG. 2) and a frequency-to-ramp converter 13 (FIG. 1 or FIG. 3). As will be described in more detail hereinafter, the frequency multiplier 5 receives variable frequency trigger pulses designated $V_T$ (FIG. 4, LINE A) and produces a fixed number of pulses between trigger pulses. The number remains fixed regardless of the trigger pulse frequency. Also, as will be described more fully hereinafter, the frequency-to-ramp converter 13 receives the fixed number of pulses and, in accordance therewith, produces a constant amplitude, linear ramp, sawtooth waveform output signal designated $V_O$ (FIG. 4, LINE E). While the frequency of the sawtooth waveform signal varies as the frequency of the trigger pulses vary, the amplitude remains constant because the between trigger pulse pulses applied to the frequency-to-ramp converter remain fixed.

The frequency multiplier 5 illustrated in FIG. 2 includes: a timing clock 6; a divider 7; a first counter 8; a counter latch 9; a comparator 10; a second counter 11; and a two-input AND gate 12. The timing clock 6 operates at a fixed frequency, such as 1.3 MHz, and synchronizes the first and second counters 8 and 11, which may be 12-bit binary counters. More specifically, the divider 7 divides the clock frequency by a predetermined amount such as 250. The first counter 8 is clocked by the divided amount—5.2 kHz. While one actual embodiment of the invention operates at the frequencies specified above, it is to be understood that other frequencies may be used with equal success.

The trigger pulse period is measured by the first counter 8 and the result is stored in the counter latch 9. In this regard, the trigger pulses, $V_T$, are applied to the clear (CL) inputs of the divider 7 and the first counter 8, and to the clock (CK) input of the counter latch 9. The first counter 8 begins counting after detecting a suitable edge, preferably, the leading edge of a trigger pulse, $V_T$. Upon detection of a subsequent trigger pulse, $V_T$, the first counter 8 is reset to zero and begins counting the next $V_T$ pulse period. Just before the leading edge of a trigger pulse, $V_T$, clears the first counter 8, and the count of the first counter 8 is clocked into the counter latch 9. Thus, the count value stored in the counter latch 9 is equal to the $V_T$ pulse period.

The trigger pulse period count stored in the counter latch 9 is continuously digitally compared in the comparator 10 with the output of the second counter 11, which is clocked at the clock frequency, e.g., 1.3 MHz. More specifically, the output of the timing clock 6 is applied to the clock (CK) input of the second counter 11. The output of the counter latch 9 is applied to one input of the comparator 10, designated the A input; and, the output of the second counter 11 is applied to the second input of the comparator 10, designated the B input. The comparator output shifts from a low state to a high state when the B input equals the A input. The output of the comparator 10 is applied to one input of the AND gate 12. The output of the timing clock 6 is applied to the second input of the AND gate 12, which is an inverted input. The output of the AND gate 12 is applied to the clear (CL) input of the second counter 11. Thus, the second counter 11 is automatically reset when output of the second counter 11 matches the latched count of the first counter 8 after a short (one half-clock cycle) delay created by the AND gate 12. The delay allows the comparator 10 to produce a stabilized output prior to the second counter 11 being cleared. The number of pulses produced at the output of the AND gate 12 as a result of the output of the comparator 10 shifting states during each trigger pulse period equals the divider division factor, e.g., 250. Thus, the AND gate 12 output, designated $V_F$ (FIG. 4, LINE B), consists of 250 pulses for each period of the trigger pulse, $V_T$. This pulse count remains fixed, regardless of the trigger pulse frequency.

The frequency-to-ramp converter 13 illustrated in FIG. 3 comprises: a monostable multivibrator 17; two buffer amplifiers 19 and 20; an integration circuit 14; a filter circuit 15; an error signal feedback circuit 16; and, a sweep disable circuit 18. The monstable multivibrator 17 is triggerd by the $V_F$ pulses produced at the output of the AND gate 12 in the manner described above and produces a rectangular wave output, designated $V_M$ (FIG. 4, LINE C). The rectangular waves, $V_M$, are of equal width and one rectangular wave, $V_M$, is produced for each trigger pulse, $V_T$. Since the frequency of the $V_F$ pulses is variable, the frequency of the equal width $V_M$ waves is variable. However, like the $V_F$ pulses, a fixed number of $V_M$ waves are produced for each $V_T$ pulse period.

The rectangular wave output $V_M$ is amplified by the first buffer amplifier 19 and integrated by the integration circuit 14. The integration circuit 14 includes: two switches designated S1 and S2; a variable resistor designated R1; a capacitor designated C1; and, an operational amplifier designated OA1. The output of the first buffer amplifier 19 controls the open/closed state of S1, which, preferably, is a semiconductor switch. One terminal of S1 is connected through R1 to a negative voltage source designated $-V$. The other terminal of S1 is connected to the inverting input of OA1. The noninverting input of OA1 is connected to ground. C1 is connected between the output of OA1 and the inverting input of OA1. S2 is connected in parallel with C1. The open/closed state of S2 is controlled by the trigger pulses, $V_T$, which are amplified by the second buffer amplifier 20. Like S1, preferably, S2 is a semiconductor switch. In operation, each $V_T$ pulse resets the integration circuit by causing S2 to close and short C1. As a result, C1 is discharged to zero. Thereafter, each $V_F$ pulse causes the monostable multivibrator 17 to produce a rectangular wave $V_M$ in the manner heretofore described. As also described above, each $V_M$ rectangular wave is of equal width. Thus, each $V_M$ rectangular wave closes S1 for the same period. During each S1 closure period, an incremental charge is added to C1. Since the S1 closure times are the same, the incremental charge is the same for each S1 closure. Thus, the output of the integrator is a stair step wave, designated $V_I$ (FIG. 4, LINE D). The rise time of each step is the same because the incremental charge is the same. Further, the same number of steps is produced between each $V_T$ trigger pulse because the same number of $V_F$ pulses are produced between each $V_T$ trigger pulse. As a result, each $V_I$ stair step wave produced at the output of the integration circuit reaches the same fixed peak amplitude, starting from zero, regardless of the frequency of $V_T$. Upon loss of the trigger pulse, $V_T$, the sweep disable circuit 18 disables the monostable multivibrator 17, preventing the output by the sweep generator circuit from exceeding a predetermined voltage magnitude until the leading edge of the next trigger pulse $V_T$ is detected. More specifically, the input of the sweep disable circuit 18 is connected to the output of the integration circuit 14 and the output of the sweep disable circuit 18 is connected to the enable input of the monostable multivibrator 17. If the integration circuit 14 output, designated $V_I$, exceeds a predetermined value, the sweep disable circuit 18 disables the monostable multivibrator 17.

The steps of the $V_I$ stair step output of the integration circuit 14 are collected by the filter circuit 15 and the error signal feedback circuit 16 with respect to linearity and peak amplitude. The filter circuit 15 comprises: a switching RC network formed by a resistor designated R2, a capacitor designated C2, and a switch designated S3. More specifically, the output of the integration circuit 14, $V_I$, is applied to one side of R2 which is connected to C2. The other side of C2 is connected to ground. The voltage across C2, designated $V_{RC}$, is applied to one side of C2. S3 is connected in parallel with C2. The open/closed state of S3 is controlled by the trigger pulses, $V_T$, such that S3 is closed each time a trigger pulse, $V_T$, occurs. Consequently, the filter circuit 15 is reset each time a trigger pulse, $V_T$, occurs. The output of the integration circuit, $V_I$, controls the charge on C2 and, thus, $V_{RC}$, filtered by the time constant of R2 and C2.

The voltage across C2, $V_{RC}$, is also controlled by the error signal feedback circuit 16. More specifically, the error signal feedback circuit 16 comprises: two resistors designated R3 and R4; a capacitor designated C3; an operational amplifier designated OA2; and, a switch designated S4. The output of the integration circuit 14, $V_I$, is applied to the noninverting input of OA2. C3 is connected between the output of OA2 and the inverting input of OA2. S4 is connected in parallel with C3. The output of OA2 is connected through R3 to C2. The voltage across C2, $V_{RC}$, is applied through R4 to the inverting input of OA2. The open/closed state of S4 is controlled by the trigger pulses, $V_T$, via the second buffer amplifier 20 such that S4 is closed and C3 shorted each time a trigger pulse, $V_T$, occurs. Thus, like the integration circuit 14 and th filter circuit 15, the error signal feedback circuit 16 is reset each time a trigger pulse, $V_T$, occurs. Between trigger pulses, $V_T$, OA2 compares $V_I$ with $V_{RC}$ and the difference therebetween controls the charge on C3. The charge on C3, in turn, controls in part the value of $V_{RC}$. In essence, the feedback circuit 16 integrates the difference between the stair step waveform, $V_I$, and the filtered waveform, $V_{RC}$, and adds the resulting waveform, $V_E$, to $V_{RC}$ after matching the slope of $V_{RC}$ by filtering $V_E$ through the filter formed by R2 and C2. The end result is a variable frequency, fixed amplitude linear ramp waveform, designated $V_O$ (FIG. 4, line E).

While a preferred embodiment of the invention has been illustrated and described herein, it will be appreciated that various changes can be made without defeating the spirit of the invention. For example, clock pulses at a multitude of different frequencies could be applied to the first and second counters and various different components and combinations of components could be used to form the waveshaping circuits described above. Consequently, within the scope of the appended claims, the invention can be practiced other than as specifically described herein.

The embodiments of the invention in which an exclusive property or privilege is claimed are defined as follows:

1. A digital sweep generator for receiving externally generated trigger pulses and producing a constant amplitude sawtooth waveform having a smooth ramp extending between a first voltage level and a second voltage level for each trigger pulse that is independent of the frequency of said trigger pulses, said digital sweep generator comprising:
   a digital frequency multiplier for receiving externally generated trigger pulses and producing a predetermined number of pulses for each trigger pulse, said predetermined number remaining constant regardless of variations in the frequency of said trigger pulses; and,
   a frequency-to-ramp converter connected to said digital frequency multiplier for receiving in seriatum sets of said predetermined number of pulses produced by said digital frequency multiplier, converting said sets into a stair step sawtooth waveform signal and smoothing said stair step sawtooth waveform signal to create a smooth ramp, constant amplitude, sawtooth waveform signal.

2. The digital sweep generator claimed in claim 1, wherein:
   (a) said digital frequency multiplier comprises:
      (i) clock means for generating clock pulses;
      (ii) first counting means for receiving said externally generated trigger pulses and connected to said clock means for counting clock pulses between trigger pulses;
      (iii) holding means connected to said first counting means for receiving and holding the clock pulse counts counted by said first counting means between trigger pulses;
      (iv) second counting means connected to said clock means for counting clock pulses at a rate that is a multiple of the clock pulse counting rate of the first counting means;
      (v) comparing means for comparing the clock pulse counts held by said holding means to the clock pulses counted by said second counting means and producing a pulse each time the pulse count of said second counting means equals the clock pulse count held by said holding means, said pulses produced by said comparing means forming said predetermined number of pulses produced by said digital frequency multiplier for said trigger pulse, said pulses produced by said comparing means being applied to said second counting means to reset said second counting means; and (b) said frequency-to-ramp converter comprises:
  (i) rectangular wave generating means connected to said comparing means for receiving the pulses produced by said comparing means and producing a rectangular wave of the same width each time a pulse is produced by said comparing means;
  (ii) integrating means connected to said signalling means for integrating said rectangular waves produced by said rectangular wave generating means; and,
  (iii) filtering means connected to said integrating means for filtering the output of said integrating means.

3. The digital sweep generator claimed in claim 2, wherein said frequency-to-ramp converter also includes an error signal feedback means, connected to said filtering means and to said integrating means, for integrating the difference between the output of said integrating means and the output of said filtering means, producing a feedback signal and applying said feedback signal to said filtering means to correct the output of said filtering means with respect to linearity and peak amplitude.

4. The digital sweep generator claimed in claim 2, wherein said first counting means is connected to said clock means through a dividing means that divides the frequency of said clock pulses by a predetermined value.

5. The digital sweep generator claimed in claim 4, wherein said frequency-to-ramp converter also includes an error signal feedback means, connected to said filtering means and to said integrating means, for integrating the difference between the output of said integrating means and the output of said filtering means, producing a feedback signal and applying said feedback signal to said filtering means to correct the output of said filtering means with respect to linearity and peak amplitude.

6. The digital sweep generator claimed in claim 2, wherein the frequency of the clock pulses produced by said clock means is in the MHz range.

7. The digital sweep generator claimed in claim 6, wherein said first counting means is connected to said clock means through a dividing means that divides the frequency of said clock pulses by a predetermined value.

8. The digital sweep generator claimed in claim 7, wherein the frequency of the clock pulses produced by said dividing means in the kHz range.

9. The digital sweep generator claimed in claim 2, wherein said integrating means produces a fixed peak amplitude stair step sawtooth waveform output signal.

10. The digital sweep generator claimed in claim 2, wherein said frequency-to-ramp converter is reset by each externally generated trigger pulse.

11. The digital sweep generator claimed in claim 10, wherein said frequency-to-ramp converter also includes an error signal feedback means, connected to said filtering means and to said integrating means, for integrating the difference between the output of said integrating means and the output of said filtering means, producing a feedback signal and applying said feedback signal to said filtering means to correct the output of said filtering means with respect to linearity and peak amplitude.

12. The digital sweep generator claimed in claim 11, wherein said first counting means is connected to said clock means through a dividing means that divides the frequency of said clock pulses by a predetermined value.

13. The digital sweep generator claimed in claim 12, wherein the frequency of the clock pulses produced by said clock means is in the MHz range.

14. The digital sweep generator claimed in claim 13, wherein the frequency of the clock pulses produced by said dividing means is in the kHz range.

15. The digital sweep generator claimed in claim 14, wherein said integrating means produces a fixed peak amplitude stair step sawtooth waveform output signal.

16. The digital sweep generator claimed in claim 1, wherein said digital frequency multiplier comprises:
  (a) clock means for generating clock pulses;
  (b) first counting means for receiving said externally generated trigger pulses and connected to said clock means for counting clock pulses between trigger pulses;
  (c) holding means connected to said first counting means for receiving and holding the clock pulse counts counted by said first counting means between trigger pulses;
  (d) second counting means connected to said clock means for counting clock pulses at a rate that is a multiple of the clock pulse counting rate of the first counting means;
  (e) comparing means for comparing the clock pulse counts held by said holding means to the clock pulses counted by said second counting means and producing a pulse each time the pulse count of said second counting means equals the clock pulse count held by said holding means, said pulses produced by said comparing means forming said predetermined number of pulses produced by said digital frequency multiplier for each trigger pulse, said pulses produced by said comparing means being applied to said second counting means to reset said second counting means.

17. The digital sweep generator claimed in claim 16, wherein said first counting means is connected to said clock means through a dividing means that divides the frequency of said clock pulses by a predetermined value.

18. The digital sweep generator claimed in claim 1, wherein said frequency-to-ramp converter comprises:
  (a) rectangular wave generating means connected to said digital frequency multiplier for receiving the pulses produced by said digital frequency multiplier and producing a rectangular wave of the same width each time a pulse is produced by said digital frequency multiplier;
  (b) integrating means connected to said rectangular wave generating means for integrating said rectangular waves produced by said rectangular wave generating means; and
  (c) filtering means connected to said integrating means for filtering the output of said integrating means.

19. The digital sweep generator claimed in claim 18, wherein said frequency-to-ramp converter also includes an error signal feedback means, connected to said filtering means and to said integrating means, for integrating the difference between the output of said integrating means and the output of said filtering means, producing a feedback signal and applying said feedback signal to said filtering means to correct the output of said filtering means with respect to linearity and peak amplitude.

* * * * *